United States Patent [19]

Calviello

[11] 4,301,233
[45] Nov. 17, 1981

[54] BEAM LEAD SCHOTTKY BARRIER DIODE FOR OPERATION AT MILLIMETER AND SUBMILLIMETER WAVE FREQUENCIES

[75] Inventor: Joseph A. Calviello, Kings Park, N.Y.
[73] Assignee: Eaton Corporation, Cleveland, Ohio
[21] Appl. No.: 156,223
[22] Filed: Jun. 3, 1980

Related U.S. Application Data

[63] Continuation-in-part of Ser. No. 154,244, May 29, 1980.

[51] Int. Cl.³ .............................................. H01L 29/48
[52] U.S. Cl. ..................................... 430/314; 156/649; 156/652; 156/656; 156/664; 427/84; 427/89; 430/315; 430/316; 430/318
[58] Field of Search .................... 427/84, 89; 430/314, 430/316, 318, 315; 156/649, 652, 656, 664; 357/15

[56] References Cited

U.S. PATENT DOCUMENTS 3,762,945 10/1973 DiLorenzo ............................ 427/89
4,075,650 2/1978 Calviello ............................... 357/15
4,098,921 7/1978 Calviello ............................... 427/84

OTHER PUBLICATIONS

Fujimoto "Millimeter wave GaAs Diodes," Review of the Electrical Communication Laboratories, vol. 23, No. 7-8, pp. 939-947, Jul. 1975.

Primary Examiner—John D. Smith
Attorney, Agent, or Firm—Kevin Redmond

[57] ABSTRACT

A beam lead gallium arsenide diode having a rectangular junction perimeter conforming to that the beam lead, recovers ninety-five percent of the junction current and provides an almost perfect ideality factor of 1.07. This device is formed on a semi-insulating substrate to provide for isolation from adjacent devices on the same substrate and for confining the current to a direct path from the junction to an immediately adjacent ohmic contact. An extremely small junction area necessary for operation at millimeter wave frequencies is formed by special processing which includes the use of dry etching and the fabrication of the junction prior to passivation.

3 Claims, 29 Drawing Figures

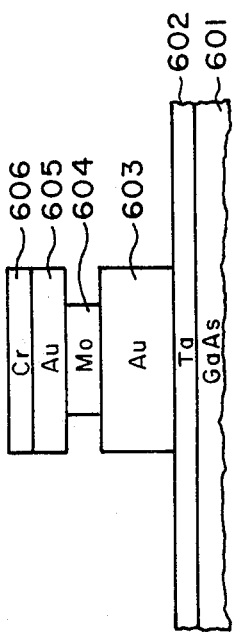
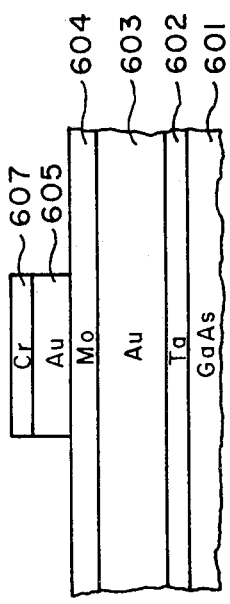
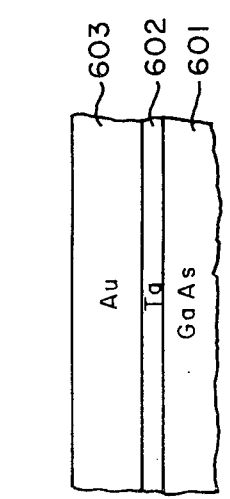
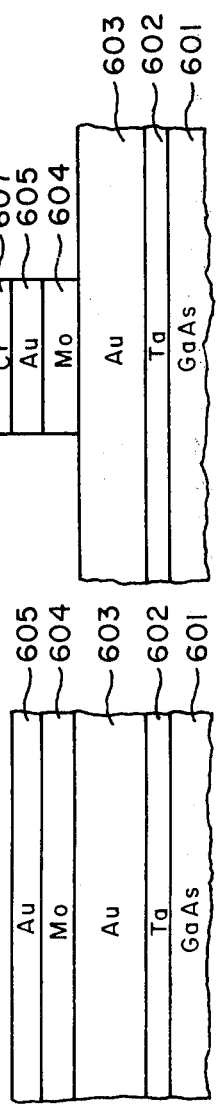
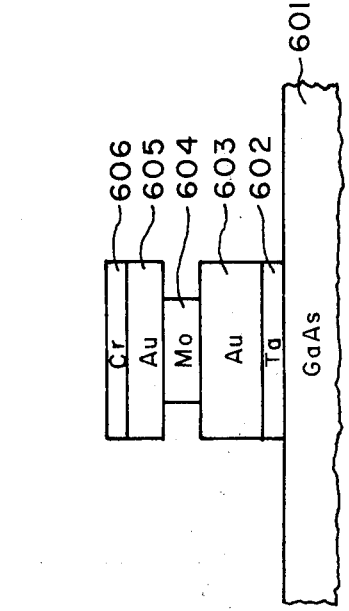
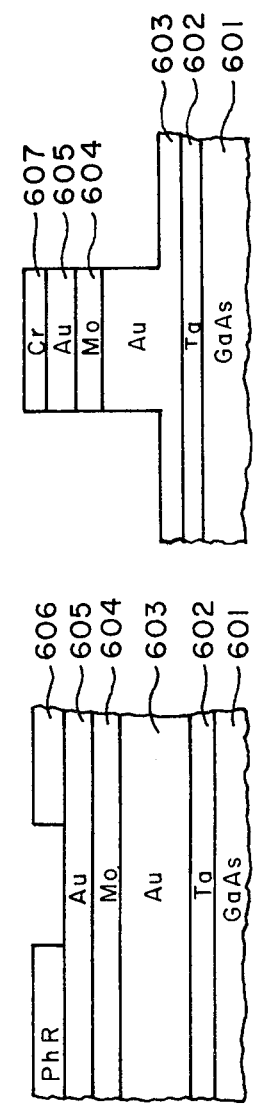
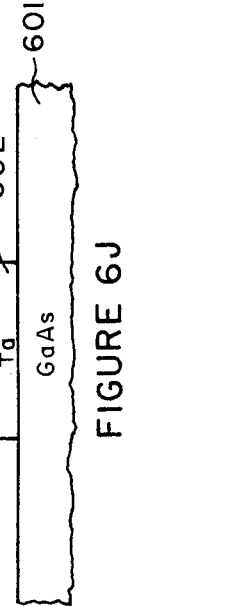
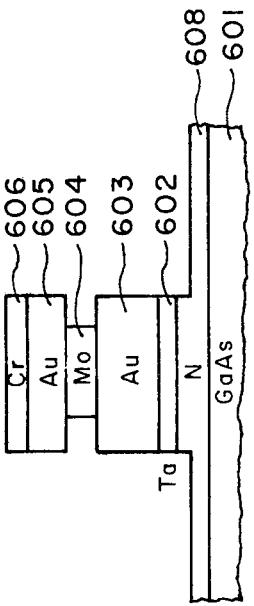
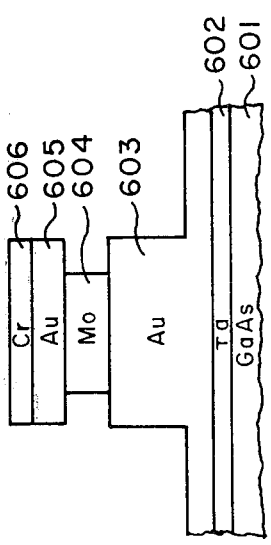
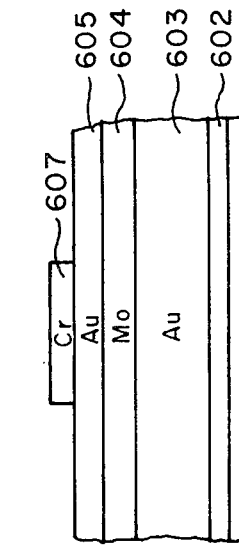

BEAM LEAD SCHOTTKY BARRIER DIODE FOR OPERATION AT MILLIMETER AND SUBMILLIMETER WAVE FREQUENCIES

This application is related to copending application Ser. No. 154,244.

This is a continuation-in-part of my prior application of the same title, Ser. No. 154,244 filed on May 29, 1980.

BACKGROUND

1. Field

This invention relates to improvements in semiconductor devices, and in particular, to semiconductor diodes designed for operation at millimeter and submillimeter wave frequencies.

2. Prior Art

Characteristics useful for the development of a high quality diodes intended for millimeter and submillimeter wave frequency operation include the ability to accurately predict skin effect contribution near the operation frequency from theoretical calculation based on device geometry and the ability to verify these calculations by low frequency measurements of the devices. Desirable device characteristics required for high performance mixer applications at these frequencies include a low value of junction capacitance at zero volt bias, a minimum of variation in junction capacitance as a function of bias, a low value of series resistance, a low value of parasitic capacitance, and nearly unity ideality factor.

The ideality factor is a measure of the perfection of the junction and is derived from the diode current equation. Diode current is given by:

$$I = I_s \left( e^{\frac{-qV}{NKT}} - 1 \right)$$

where I is the diode current, $I_s$ is the saturation current and N is the ideality factor. A perfect diode will have an ideality factor of unity.

In prior art devices, such as planar point contact devices and planar beam lead devices, the combination of all the above characteristics are not present in any one device.

In addition, epitaxial N−layers on N+substrates are currently being adopted universally as the basic substrate material for such devices. The disadvantages of this type of substrate include restricting fabrication to a single device on a simple substrate, the necessity of measuring ohmic series resistance at or near the operating frequency, a difficult and often impossible measurement at 100 GHz or higher frequency, poor reliability due to inherent, premature avalanche breakdown, and poor collection of current resulting in higher series resistance.

Prior art structures also suffer from the use of very thin silicon dioxide layers which are used to provide passivation, support of the beam leads and a surface on which to first define the junction area. Unfortunately, a thin silicon dioxide layer does not provide sufficient passivation protection for a highly reliable device and the thin passivation layer also results in high parasitic capacitance between the beam leads and the N+layer. For millimeter and submillimeter wave frequencies applications, the junction diameter can be in the low millimeter range. To produce such a small junction using planar technology, a thin passivation layer is necessary because the junction is defined photolithographically on the passivation layer. The passivation layer is then etched through to the active layer to provide for the deposition of the metal contacting layer which forms the junction. If the passivation layer were made thick, the junction would be ill defined because the etching would not proceed uniformly through a thick passivation layer.

SUMMARY

In the present invention, a well defined junction is provided despite the use of a thick protective passivation layer. This is achieved by a new process in which the junction is produced prior to the production of the passivation layers. The junction is consequently well defined, a necessary factor in fabricating a highly reliable and high performance device. The thick passivation layer provides for excellent protection of the junction as well as for separating the beam leads from the N+layer to reduce parasitic capacitance. The parasitic capacitance is further reduced by removing a portion of the N+layer beneath the beam leads, and then filling the void with passivation material.

The process developed for the present invention may be used to produce diodes capable of high performance and high reliability operation over the frequency range of from 30 to 300 GHz. The technique used to fabricate these devices is adaptable to micro monolithic circuit integration where many devices may be contained on a common substrate. Multiple device fabrication on a common substrate is made possible through the use of a semi-insulating substrate which serves to electrically isolate the individual devices.

The semi-insulating substrate confines the current flow to a path directly between the Schottky junction and the ohmic contact. This path is virtually identical for current flow at dc and at millimeter wave frequencies, making it possible to characterize this device at dc.

DETAILED DESCRIPTION OF THE INVENTION

FIG. 1 generally illustrates the way in which multiple diodes may be produced on the same semi-insulated substrate as well as the way beam leads may be used to make various interconnections between these diodes.

Figure 1A:
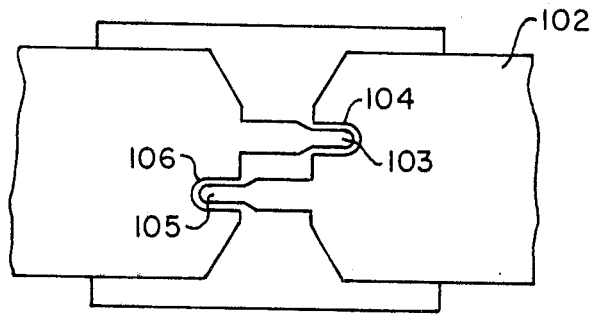
FIG. 1 illustrate various forms of multiple junctions produced on semi-insulating substrates using beam lead construction.
Figure 1B:
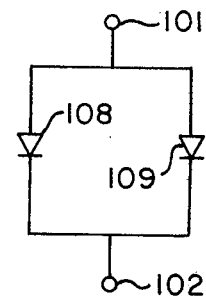
Figure 2A:
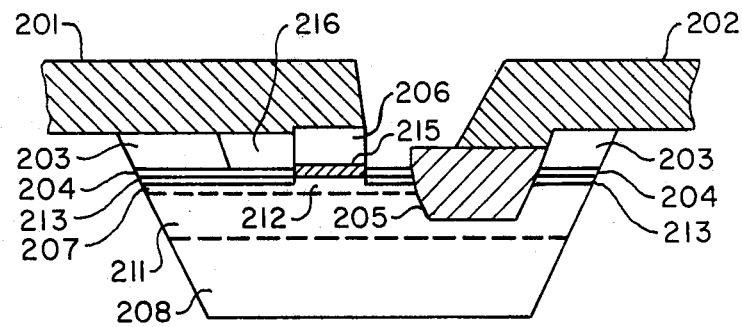
FIG. 2 shows various cross sections of a device using the present invention.

FIG. 1B is a schematic diagram showing two diodes, 108 and 109, connected in a back-to-back configuration with two external terminals, 101 and 102. FIG. 2A is a pictorial plan view of a device employing the present invention in which two diodes on a single substrate are connected in the back-to-back configuration of FIG.

1B. It can be seen in this Figure that beam leads form the external terminals, 101 and 102. A portion of the lead forms the junction area, such as areas 103 and 105. Directly opposite each junction area is an area of the ohmic contact, such as area 104 and 106. The semiconductor material of the device 107 is shown located beneath the contacts.

Figure 1C:
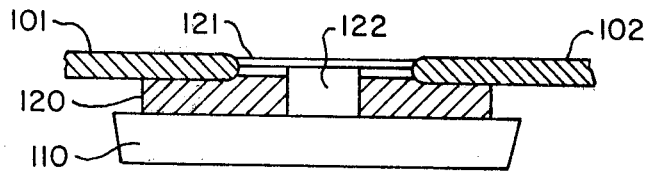

FIG. 1C is a side cross sectional view of the device shown in FIG. 1A. To illustrate only essential components, no passivation layers are shown in this Figure. Drawing numeral 121 indicates the active N—layer beneath the junction contact. Beneath the N—layer is an N+layer 120, supported on semi-insulating substrate 110. By etching through the N+layer between the two diodes 108 and 109 in the area indicated by drawing numeral 122, the two diode devices are isolated from one another, as there is virtually no current flow through the semi-insulating layer 110 because of its high resistivity.

Figure 1D:
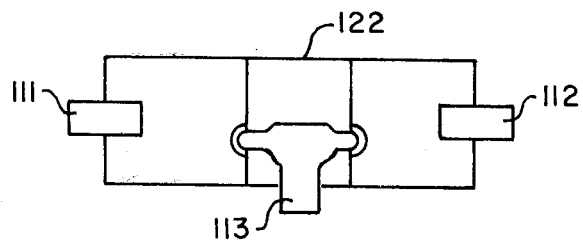
Figure 1E:
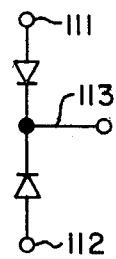

FIG. 1E is a schematic of two opposing diodes, 123 and 124, in a series circuit having a center connection 113, and two terminal connections, 111 and 112. FIG. 1D is a top plan view of a device which is configured in the series circuit shown in FIG. 1E. FIG. 1D primarily illustrates the manner in which beam leads may be used to make the required connections.

Figure 1F:
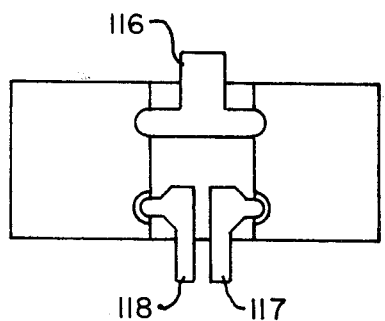
Figure 1G:
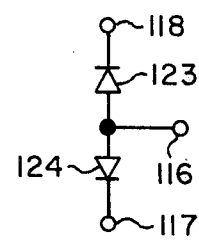

FIG. 1G is a schematic of two series opposing diodes similar to those shown in FIG. 1E with the exception that the diodes are reversed in direction. FIG. 1F is a plan view of an embodiment of the circuit shown in FIG. 1G.

Figure 2B:
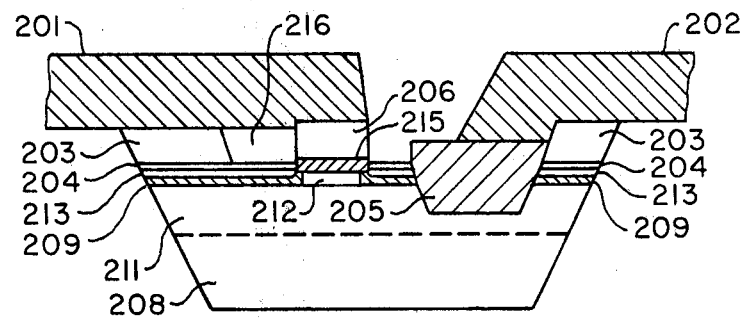
Figure 2C:
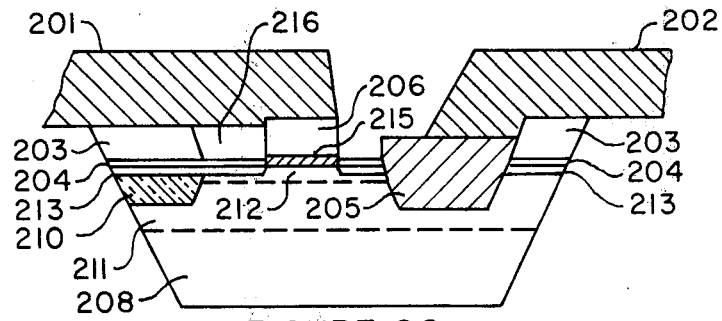

FIG. 2 is a cross sectional view of a device illustrating the composition of the present invention in detail. FIG. 2A shows the basic device while FIG. 2B shows a device which includes an added passivation layer of native oxide 209 and FIG. 2C shows a device which includes an added layer of silicon dioxide used to replace a portion of the N+layer beneath the beam leads.

FIG. 2A comprises a semi-insulating substrate 208, supporting an N+buffer layer 211, which, in turn, supports an active N—layer 212. Covering the N—layer in succession is a first silicon dioxide layer 213, a silicon nitride layer 204, and a second silicon dioxide layer 203.

The junction is formed by a tantalum layer 215 deposited directly on a portion of the N—layer. A gold layer 206 covers the tantalum layer and makes contact to a first beam lead 201. Adjacent the junction is a germanium gold ohmic contact which extends from the surface through the silicon dioxide and silicon nitride passivation layers into the N+layer. A second beam lead 202 makes contact with the germanium gold (with an overlayer of gold) ohmic contact 205.

In most prior art devices, a semi-insulating layer is not used. The lower portion of these prior art devices contains conducting material. The ohmic contact is made to this conducting material on the lower side of the device. In these devices, current flow is from the junction through the entire device to the ohmic contact. The skin effect loss is severe in such devices. This loss occurs as the operating frequency is increased beyond the VHF range. The current is concentrated by the skin effects in a region near the surface, increasing the path length and decreasing the cross sectional area through which the current can flow. This effect is covered in greater detail in connection with the discussion of FIG. 5.

In the present invention, the current flow is constrained to the region between the junction and the ohmic contact near the upper surface of the device. The semi-insulating substrate aids in constraining the current flow because it does not pass appreciable current due to its high resistivity. Fortunately, the current path in the present invention at millimeter wave frequencies is the same as it is at dc, making it possible to characterize the device at dc.

FIG. 2B is identical to FIG. 2A with the exception of the added passivation layer of native oxide 209. Native oxide is described more fully in my prior U.S. Pat. No. 4,098,921. While native oxide provides good protection against sodium ion migration silicon dioxide and silicon nitride provide good protection against other types of elements which would tend to damage the junction. Therefore, the combination of native oxide, silicon dioxide and silicon nitride provide a relatively thick and virtually perfect passivation layer.

FIG. 2C is similar to FIG. 2A except it includes an added silicon dioxide layer 210, which replaces a portion of the N+buffer layer beneath the beam lead 201 to reduce the capacity from the beam lead to the N+layer. In the present invention the multiple layers of passivation can be made relatively thick to aid in separating the beam lead from the N+layer, and thus further reduce the parasitic capacity of the beam leads.

Figure 4:
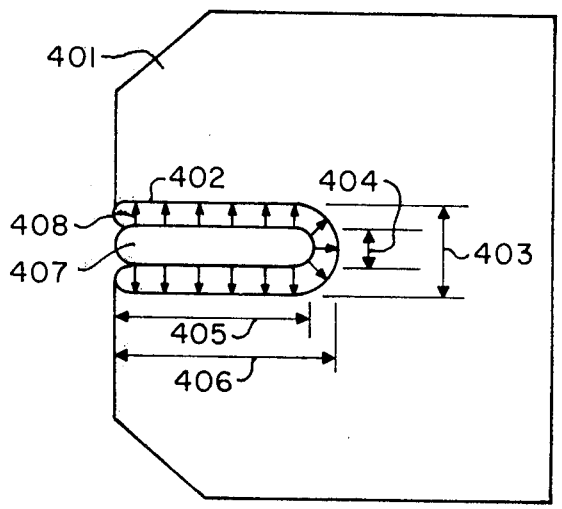
FIG. 4 illustrates the distribution of current flow from the junction to the ohmic contact in the present invention.

FIG. 4 is a top plan view of a diode fabricated in accordance with the present invention. This Figure illustrates the details of the junction and ohmic contact structures as well as the current flow between the two. The terminal for the ohmic contact 401 includes an area 402 immediately adjacent the junction contact area 407. The current flow from the junction to the ohmic contact is illustrated by a series of directional flow arrows 408. The junction length 405, typically ranges from 5 to 10 microns, while the junction width 404 typically ranges from 0.5 to 1 micron. The length of the area 406 typically ranges from 8 to 15 microns, while width 403 typically ranges from 3 to 8 microns.

To achieve very low ohmic losses, it is essential to minimize skin effect losses, reduce interelectrode spacing and collect at least ninety-five percent of current emanating from the junction. These goals are achieved by the device shown in FIG. 4.

Note that the junction geometry in FIG. 4 is rectangular instead of circular. The rectangular configuraton is essential in achieving the high percentage of current collection. Current is collected in every direction about the junction as indicated by the arrows, except for the small area under the beam lead at the extreme left of the junction area 407.

Figure 3:
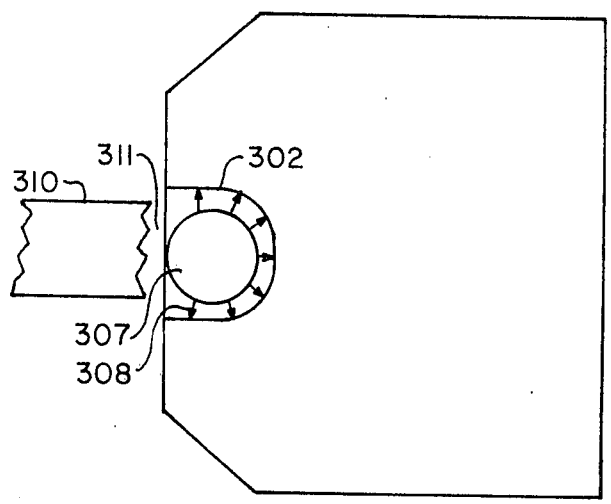
FIG. 3 shows a typical circular configuration for a prior art Schottky junction.

The area over which current is collected is reduced in prior art devices, as illustrated in FIG. 3. In this Figure, a beam lead 310 is broken away to reveal a circular junction area 307. Current flow between the junction area and the ohmic contact area 301 is indicated by the current flow arrows 308. Note that current is collected along the edge of the ohmic contact area indicated by drawing numeral 311 because there is no ohmic contact in that area. Calculations show that up to 40 percent of the current is not recovered in devices using the prior art circular junction configuration, whereas ninety-five percent is recovered with the rectangular configuration of the present invention.

Figure 5:
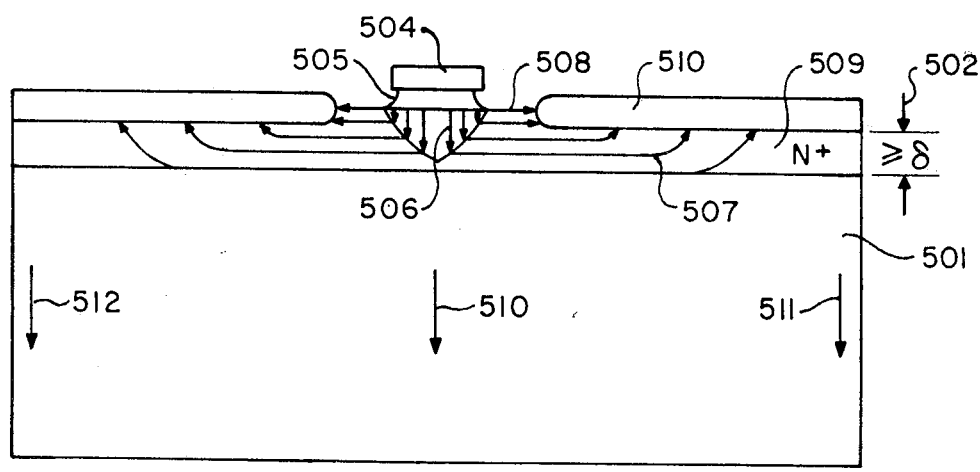
FIG. 5 shows a cross sectional view of the present invention and the current flow within the active layer.

The current flow in the present invention in the plan view has been shown in FIG. 4. The current flow in a side cross sectional view is shown in FIG. 5. In this Figure, a semi-insulating layer 501, supports an N±layer 509. Covering a portion of the N+layer is an ohmic contact 510. In another area, a mesa of N material rests on the N+layer. Covering the N−layer is a junction contact 504.

A portion of the current indicated by drawing numeral 508 in FIG. 4 flows near the surface from the junction to the ohmic contact. Another portion 506 flows downward, and then horizontally 507 through the N+layer to the ohmic contact 510. The N+layer is at least one skin depth thick at the operating frequency of the device, as indicated by drawing numeral 502. Virtually no current flows through the semi-insulating layer 501 because of its high resistivity. Since the current is constrained to flow through the same cross sectional area at dc as it flows through at the operating frequency, the device can be characterized at dc, a significant advantage, since it is extremely difficult to make characterization measurements at millimeter wave frequencies.

The ohmic contact in many prior art devices is located on the lower surface of the device. At low frequencies, the current flows through the device from the junction to the lower surface, as indicated by the current flow arrow 510. As the frequency increased, the current is constrained to flow along the surface of the device. This flow is indicated by the current flow arrows 511 and 512. In such a device, the current must travel through a longer path and through a smaller cross sectional area to reach the ohmic contact. The result is a greater series resistance which seriously limits the millimeter wave frequency performance.

Applying the fabrication technology of the present invention which will be described below, it is possible to define extremely small junction areas with a high degree of resolution. Devices fabricated in accordance with this technology exhibit nearly unity ideality factor, a series resistance of less than three ohms, and a zero volt junction capacity of less than 0.01 pf. In addition, the fabrication process employs a dry etch plasma technique which provides a high degree of uniformity and reliability.

Figure 6L:
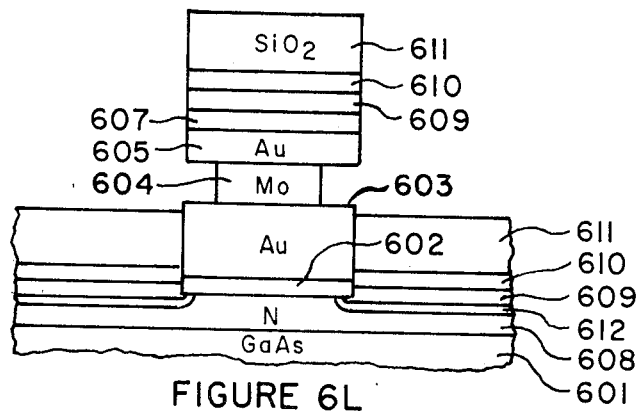
FIG. 6 illustrates the process steps used in fabricating the present invention.
Figure 6M:
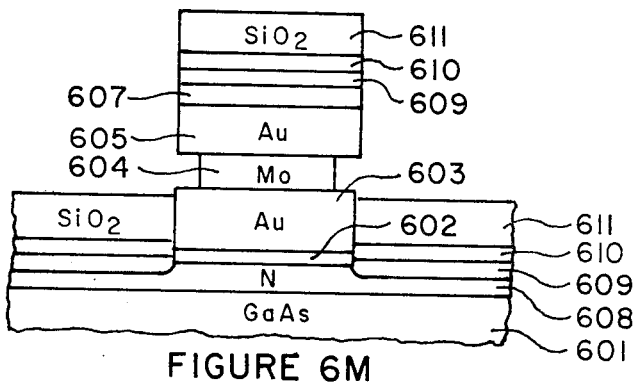
Figure 6N:
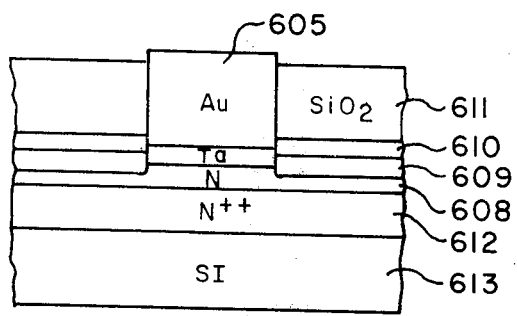
Figure 6O:
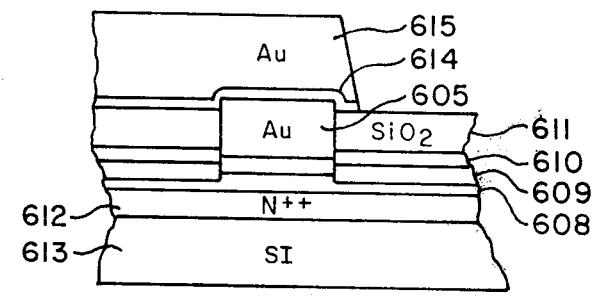
Figure 6P:
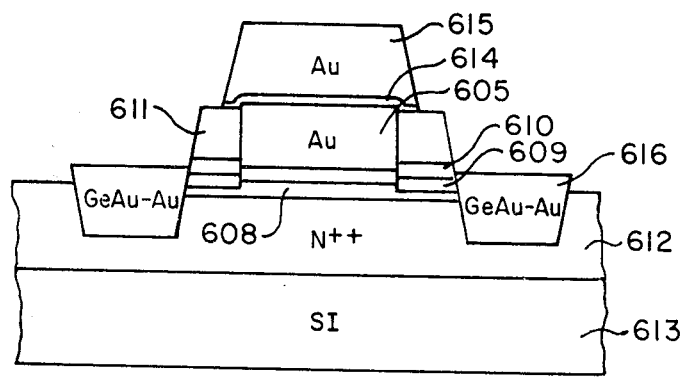

The steps in the process are illustrated in FIGS. 6A through 6P. To reduce the possibility of encountering interfacial contamination or oxide growth between the Schottky contact and the active N layer, the devices are first subject to a thorough chemical cleaning of the surface followed by the formation of the Schottky junction in a high vacuum vac-ion oil-free system.

The first step in the process is illustrated in FIG. 6A. In this Figure, a gallium arsenide substrate 601 is shown to support a layer of tantalum 602. Covering the tantalum layer is a layer of gold 603. The tantalum layer in contact with the gallium arsenide substrate forms the Schottky junction. The gold layer forms the junction contact. The tantalum and gold layers are produced by evaporation in the high vacuum system described above to a thickness of approximately 1500 Å and 9,000 Å respectively.

The second step is shown in FIG. 6B. In this step, a layer of molybdenum 604 and a second layer of gold 605 are sputter deposited sequentially to a thickness of approximately 3000 Å each.

The third step is shown in FIG. 6C. In this step, a layer of photoresist 606 is applied to the second gold layer, exposed to define the junction area, and then developed to expose the portion of the second gold layer over the junction area.

The fourth step comprises depositing a layer of chromium approximately 1500 Å thick in the exposed area over the second gold layer. The remaining photoresist is then removed, leaving the structure shown in FIG. 6D. The chromium layer in this step is used to define the pattern of the Schottky contact, the dimensions of which are typically 1 by 8 microns for mixer applications in the millimeter wave frequency range.

For the fifth and following steps, the wafer is placed in an RF sputtering system. Using a ninety percent argon and ten percent oxygen atmosphere at a pressure of 5 to 13 u and at a power level of 50 to 70 watts, the second gold layer is etched in the pattern of the chromium layer as shown in FIG. 6E. During this step, the chromium layer is not removed. It is only oxidized and remains as a mask or hat to protect the material beneath it.

In the sixth step, a ninety-eight percent carbon-tetrafloride and two percent oxygen atmosphere at a pressure of from 200 to 400 um, and at a power level of 50 to 70 watts, is used to etch the molybdenum layer, as shown in FIG. 6F.

In the seventh step, the conditions of step 5 are used to remove by etching from forty to eighty percent of the first gold layer, as shown in FIG. 6G.

In the eighth step, the conditions of step 6 are used, except the pressure is increased to from 500 to 700 u to etch an undercut in the molybdenum layer, as shown in FIG. 6H.

In step 9, the conditions of step 5 are used to complete the etching of the first gold layer, as shown in FIG. 6I.

In step 10, the conditions are returned to those of step 8 to etch and remove the tantalum layer not protected by the chromium, as illustrated in FIG. 6J.

In step 11, a very light chemical etch is employed to produce a mesa in the N layer with a height of about 2000 Å as illustrated in FIG. 6K. The N layer is the active layer in the gallium arsenide substrate 601 located immediately beneath the tantalum layer. The N layer is indicated in FIG. 6 by drawing numeral 608.

In step 12, the wafer is oxidized in a solution of hydrogen peroxide in accordance with my prior U.S. Pat. No. 4,098,921. As an alternate to using hydrogen peroxide, an oxidizing plasma may be used to produce a native oxide passivation coating, indicated in FIG. 6L by drawing numeral 612.

In step 13, successive passivation layers are sputter deposited on the device as shown in FIGS. 6L and 6M. The layers comprise a first layer of silicon dioxide 609, a layer of silicon nitride 610, and a second layer of silicon dioxide 611, having thicknesses of 2000, 1500 and 6000 Å, respectively. Where it is desired not to use native oxide, the remaining three layers of passivation may be applied directly to the device as illustrated in FIG. 6M.

In step 14, the device is submerged in a 30 percent acqueous solution of hydrogen peroxide to etch through the molybdenum layer. Note that the undercutting of the molybdenum layer in step eight causes the first gold layer 605 and the metalic layers above to act as a mask for the molybdenum, preventing the passivation layers from covering the molybdenum layer. By this process, the molybdenum layer is left exposed to the etching effect of the hydrogen peroxide and the molybdenum, as well as all the layers above it are removed leaving the structure shown in FIG. 6N. Note in this Figure, two additional layers within the gallium arsenide substrate are revealed. The first is a conducting layer 608 referred to as the N+layer. This layer is located directly beneath the N layer. The second is the semi-insulating layer 613 located directly beneath the N+layer.

In step 15, the device is placed in a high vacuum or sputtering system to deposit a second layer of chromium or tantalum 614 approximately 500 Å thick and then a third layer of gold 615, approximately 30,000 Å thick. The gold is then covered with a layer of tantalum, approximately 2000 Å thick. Using the etching processes described above with a carbon-tetra-floride-oxygen atmosphere and an argon-oxygen atmosphere, a beam lead is defined in the third gold layer, as shown in FIG. 6O.

In step 16, photoresist is applied and the ohmic pattern is defined. Using a carbon-tetra-floride atmosphere at a pressure of 100 to 300 microns and at a power level of approximately 30 watts, the passivation layers 609, 610 and 611 are sputter etched in the areas in which the ohmic contact is to be made. Using a solution of $H_2SO_4$, $H_2O_2$ and $H_2O$ in the ratio of 8:1:1, approximately 8000 Å of the gallium arsenide substrate are etched away in the area defined by the photoresist for the ohmic contact. A layer of germanium gold 1500 Å thick is first deposited in the etched away area. This is followed by a layer of gold 10,000 Å thick to form the ohmic contact 616 shown in FIG. 6P.

Since the final steps of applying a beam lead connection to the ohmic contact and chemical etching the substrate to achive chip separation are standard and well known, they are not illustrated.

Having described my invention, I claim:

1. A process for producing a Schottky barrier junction device comprising the following steps:
   (a) supplying a substrate with an N+layer covered with an N layer,
   (b) depositing a first layer of tantalum on the N layer to form a Schottky barrier junction,
   (c) depositing a first layer of gold over the tantalum layer,
   (d) depositing a layer of molybdenum over the first gold layer,
   (e) depositing a second layer of gold over the molybdenum,
   (f) depositing a layer of photoresist over the second layer of gold,
   (g) exposing and developing the photoresist to define the junction area by exposing the second layer of gold in the junction area,
   (h) depositing a layer of chromium over the photoresist and the exposed junction area of the second gold layer,
   (i) removing the photoresist to provide a chromium mask over the junction area,
   (j) etching the second gold layer away except where it is protected by the chromium mask in the junction area,
   (k) etching the molybdenum layer away except in the junction area,
   (l) etching through a portion of the first gold layer away from the junction area,
   (m) etching the molybdenum layer to produce an undercut about its periphery within the junction area,
   (n) etching through the remainder of the first gold layer in the area away from the junction area,
   (o) etching away the first tantalum layer except in the junction area,
   (p) etching into the N layer except in the junction area to produce a mesa in the N layer in the junction area,
   (q) depositing a layer of passivation over the device except on the under-cut molybdenum layer which is shielded from this deposition by the gold and chromium layers above the molybdenum layers,
   (r) etching through the molybdenum layer left unprotected by the absence of the passivation layer, and
   (s) removing the second layer of gold and the chromium layers after etching through the molybdenum layer.

2. A process as claimed in claim 1, wherein said passivation layer comprises successive layers of silicon dioxide, silicon nitride, and silicon dioxide.

3. A process as claimed in claim 2, wherein said passivation layer further comprises a layer of native oxide produced prior to the application of the three successive layers.

* * * * *